United States Patent [19]
Aizpuru et al.

[11] Patent Number: 5,466,954
[45] Date of Patent: Nov. 14, 1995

[54] SHUNT PHOTOTRANSISTOR WITH REVERSE BIAS PROTECTION

[75] Inventors: Jose J. Aizpuru, Garland; Walter T. Matzen, Richardson, both of Tex.

[73] Assignee: Honeywell Inc., Minneapolis, Minn.

[21] Appl. No.: 360,486

[22] Filed: Dec. 21, 1994

[51] Int. Cl.⁶ .............................. H01L 27/14; H01L 31/00
[52] U.S. Cl. .......................... 257/187; 257/462; 257/465; 257/491; 307/100; 307/117
[58] Field of Search ..................... 257/462, 465, 257/491, 187, 188; 307/100, 117

[56] References Cited

U.S. PATENT DOCUMENTS

| | | | |
|---|---|---|---|
| 2,944,765 | 7/1960 | Stuetzer | 257/462 |
| 2,948,815 | 8/1960 | Willems et al. | 257/462 |

FOREIGN PATENT DOCUMENTS

| | | | |
|---|---|---|---|
| 54-136287 | 10/1979 | Japan | 257/462 |
| 2278773 | 11/1990 | Japan | 257/462 |

*Primary Examiner*—William Mintel
*Attorney, Agent, or Firm*—William D. Lanyi

[57] ABSTRACT

A phototransistor is provided with a first resistor that operates as a shunt and a second resistor that operates to protect the device from damage that could be caused by a reverse bias condition. The possible damage results from the creation of a PN junction relationship caused by the doping of N conductivity type material with P⁺ conductivity type material in order to form the first resistor. This junction relationship creates a parasitic diode that provides a current path between the emitter and collector terminals of the phototransistor. In order to prevent damage that might occur during a reverse voltage connection, a second resistor is connected between the emitter of transistor $Q_1$ and the first resistor. The second resistor is in series with the junction relationship resulting from the structure used to form the first resistor and therefore serves to limit the current flowing between the emitter and collector terminals of the transistor under reversed bias conditions.

18 Claims, 11 Drawing Sheets

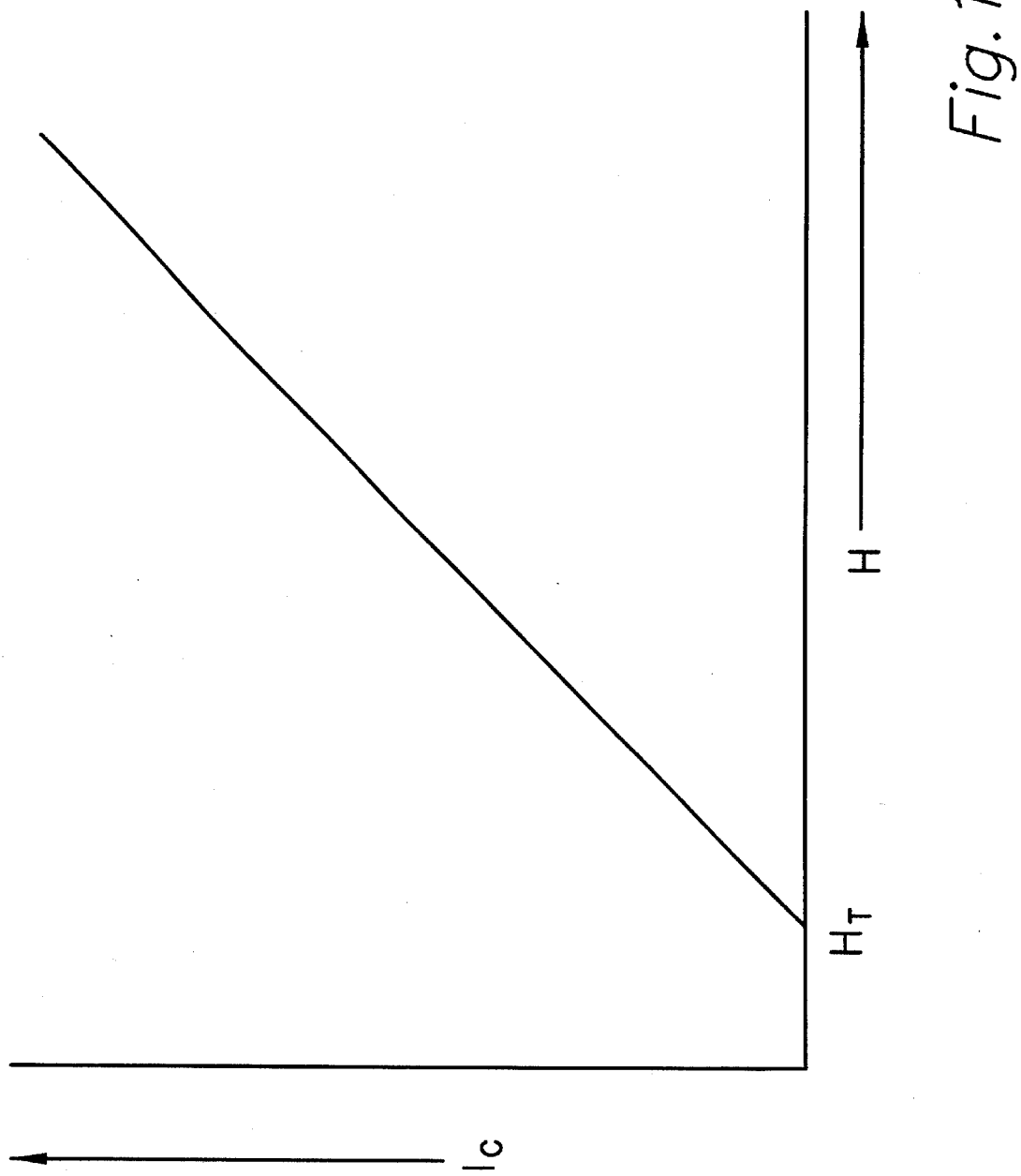

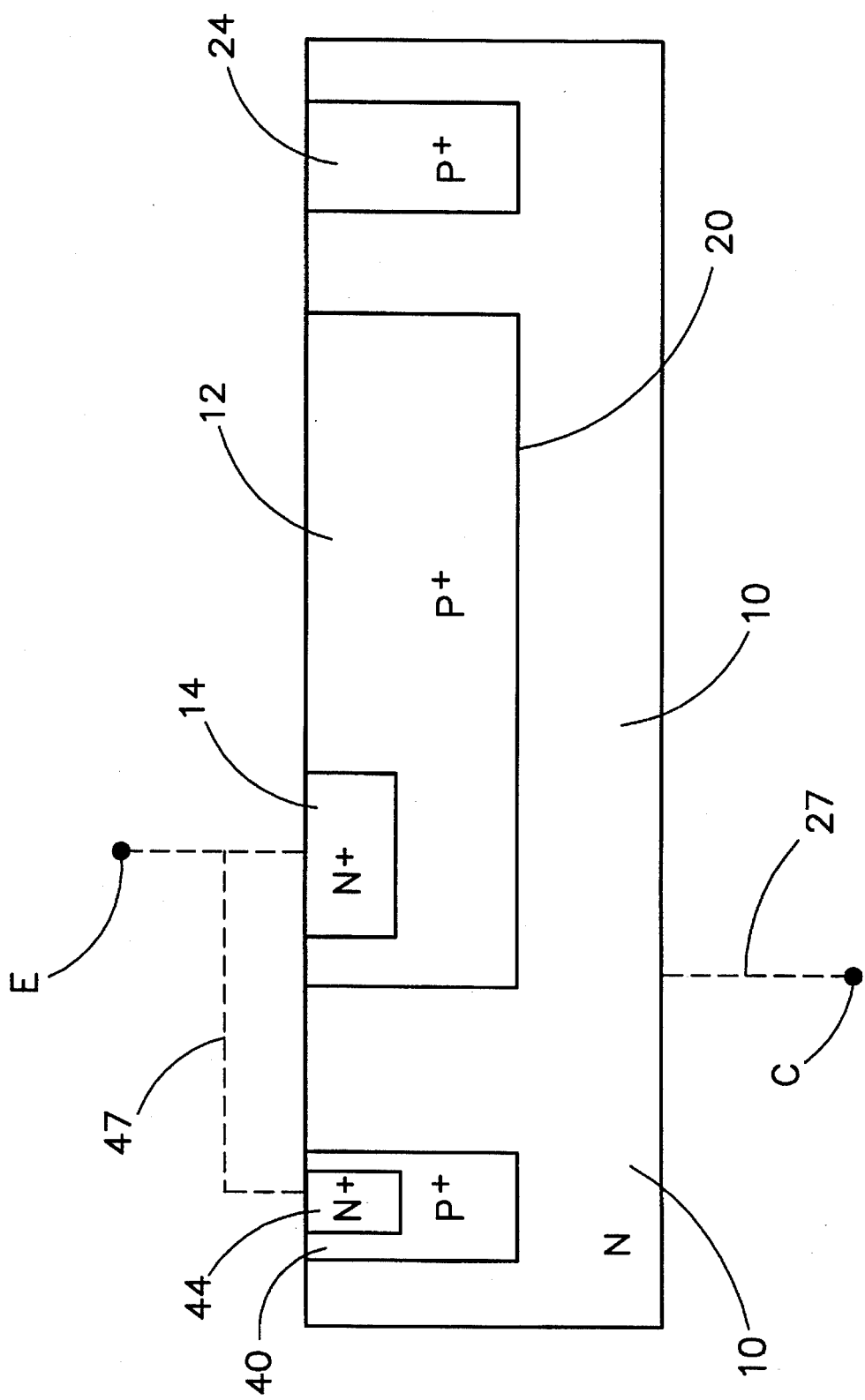

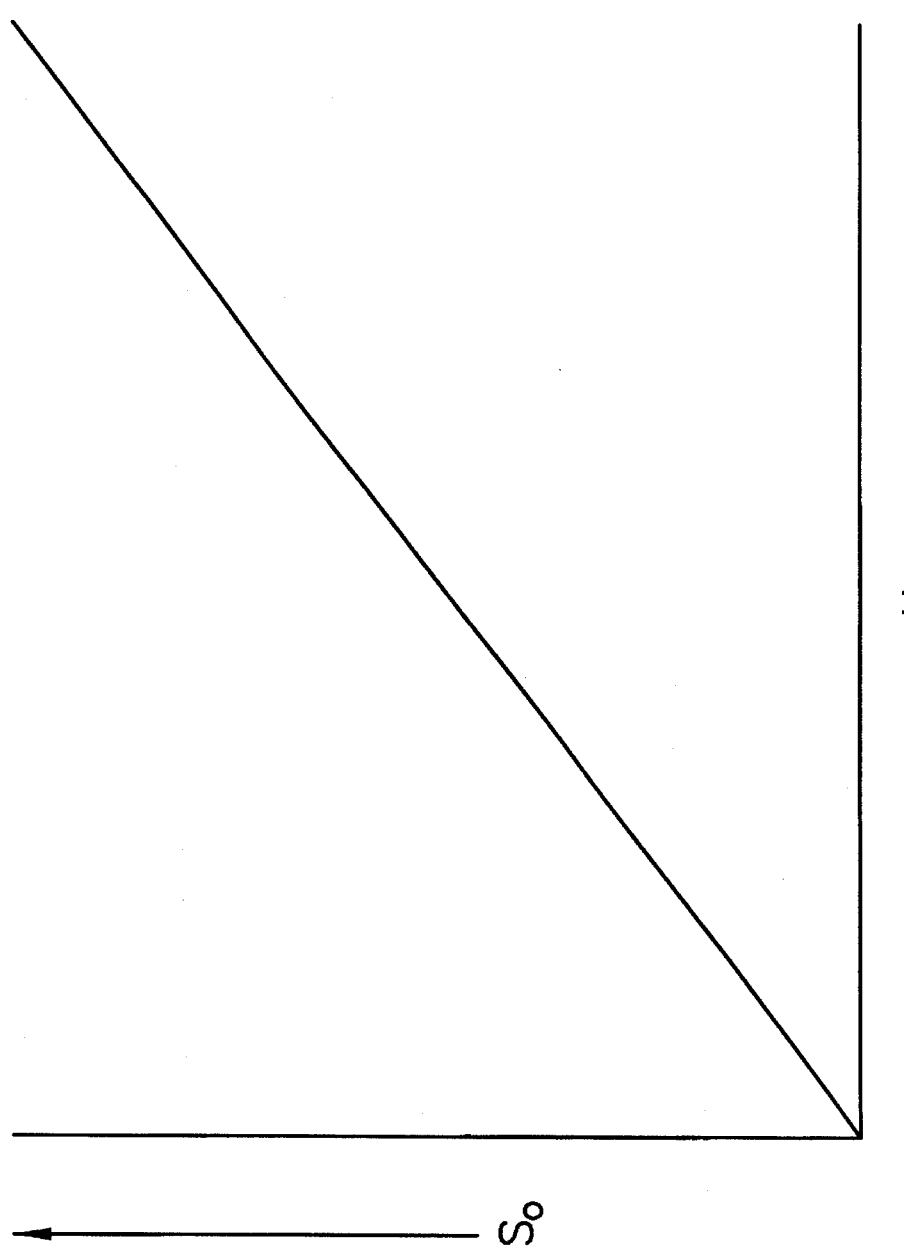

SHUNT PHOTOTRANSISTOR WITH REVERSE BIAS PROTECTION

BACKGROUND OF THE INVENTION

1. Field of the Invention

The present invention is generally related to phototransistors and, more particularly, to a shunt phototransistor circuit which provides an increased level of protection in the event of a reverse voltage condition.

2. Description of the Prior Art

Phototransistors are well known to those skilled in the art. Since phototransistors are generally more sensitive than photodiodes to changes of illumination, they are preferred as switching devices in some applications where fairly small changes in the level of illumination are expected. The phototransistor works both as a PN junction photodetector and an amplifier of the current generated by incident light. Phototransistors, like photodiodes, respond to light energy that affects the silicon lattice near and within a PN junction. The frequency of the light must be in the correct range. In other words, the energy of the photons must be sufficient to break the covalent bonds within the semiconductive material. For silicon, light in the near infrared and visible regions of the spectrum will cause this type of response.

Some phototransistors are provided with a shunt resistor that establishes a threshold optical signal level below which the light is insufficient to provide an electrical signal. As will be described in greater detail below, the use of a threshold in this manner is beneficial, particularly in reflective sensors where the threshold provides an enhanced contrast ratio between light and dark surfaces. In certain other applications, the threshold level can be useful for preventing turn on by leakage current at elevated temperatures. When phototransistors are fabricated with integrated shunt resistors, their use is limited in certain applications since excessive current may flow when these devices are connected with reverse bias voltage across the collector and emitter of the transistor.

It would therefore be beneficial if a phototransistor could be fabricated with a shunt resistor and a means for preventing damage that could otherwise be caused by a reverse voltage placed across the collector and emitter of the transistor.

SUMMARY OF THE INVENTION

The present invention provides a phototransistor that is fabricated with a shunt resistor and a means for protecting the device from damage that could otherwise be caused by connecting the phototransistor with a reverse bias. The phototransistor component, in a preferred embodiment of the present invention, comprises a transistor which has an emitter, a collector and a base. It also comprises a diode, having an anode and a cathode. The anode of the diode is connected in electrical communication with the base of the transistor. The cathode of the diode is connected in electrical communication with the collector of the transistor. A first resistor, which is used as a shunt resistor, is connected in electrical communication between the anode of the diode and the emitter of the transistor. The first resistor creates a junction relationship because of its structure which, in a preferred embodiment of the present invention is a P$^+$ conductivity type region that is doped within an N conductivity type semiconductive material. The resulting junction relationship is disposed in parallel electrical relationship with the diode and the first resistor which, in turn, are connected in series with each other. This junction relationship creates a parasitic diode. A second resistor is connected in electrical communication between the first resistor and the emitter of the transistor. The second resistor is connected in electrical communication between the emitter of the transistor and the junction relationship.

In a preferred embodiment of the present invention, the transistor is formed by doping an N conductivity type semiconductive material with a first region of P$^+$ conductivity type semiconductive material and doping a portion of the first region of the P$^+$ conductivity type semiconductive material with a first region of N$^+$ conductivity type semiconductive material. The diode is formed by the first region of P$^+$ conductivity type semiconductive material and the N conductivity type semiconductive material. The first resistor is formed by doping a portion of the N conductivity type semiconductive material with a second region of P$^+$ conductivity type semiconductive material. The resulting junction relationship is formed by the second region of P$^+$ conductivity type semiconductive material and the N conductivity type semiconductive material. The second resistor is formed by doping the N conductivity type semiconductive material with a third region of P$^+$ conductivity type semiconductive material and then doping the third region of P$^+$ conductivity type semiconductive material with a second region of N$^+$ conductivity type semiconductive material.

BRIEF DESCRIPTION OF THE DRAWINGS

The present invention will be more fully and completely understood from a reading of the Description of the Preferred Embodiment in conjunction with the drawings, in which:

FIG. 1 states the relationship between the current and light intensity of a shunt phototransistor;

FIG. 4C is a side sectional view of the device shown in FIG. 4A; and

FIG. 5 is a graphical representation of the relationship between the photocurrent and irradiance in a preferred embodiment of the present invention.

DESCRIPTION OF THE PREFERRED EMBODIMENT

Figure 2A:
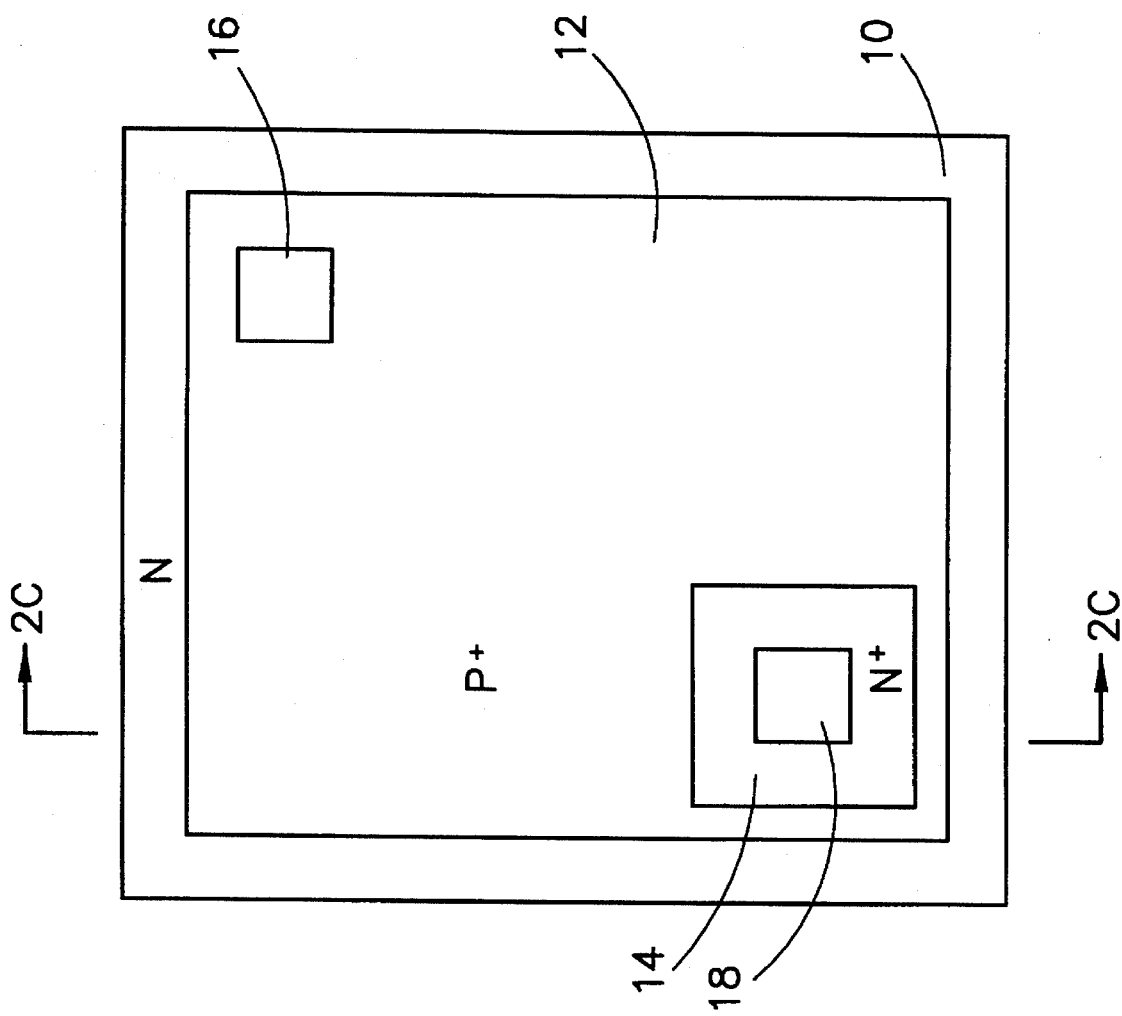
FIG. 2A is a top view of a phototransistor known to those skilled in the art.

Throughout the Description of the Preferred Embodiment, like components will be identified by like reference numerals. The present invention relates to a phototransistor that is provided with a shunt resistor connected between its emitter and base contacts. Typically, a resistor value of 700 K ohms can be used to set a desired threshold signal as shown in FIG. 1. The horizontal axis in FIG. 1 represents irradiance or optical power density and the vertical axis represents the collector current of a phototransistor. The threshold light intensity $H_T$ represents the minimum irradiance that is necessary prior to the phototransistor being turned on.

Figure 2B:
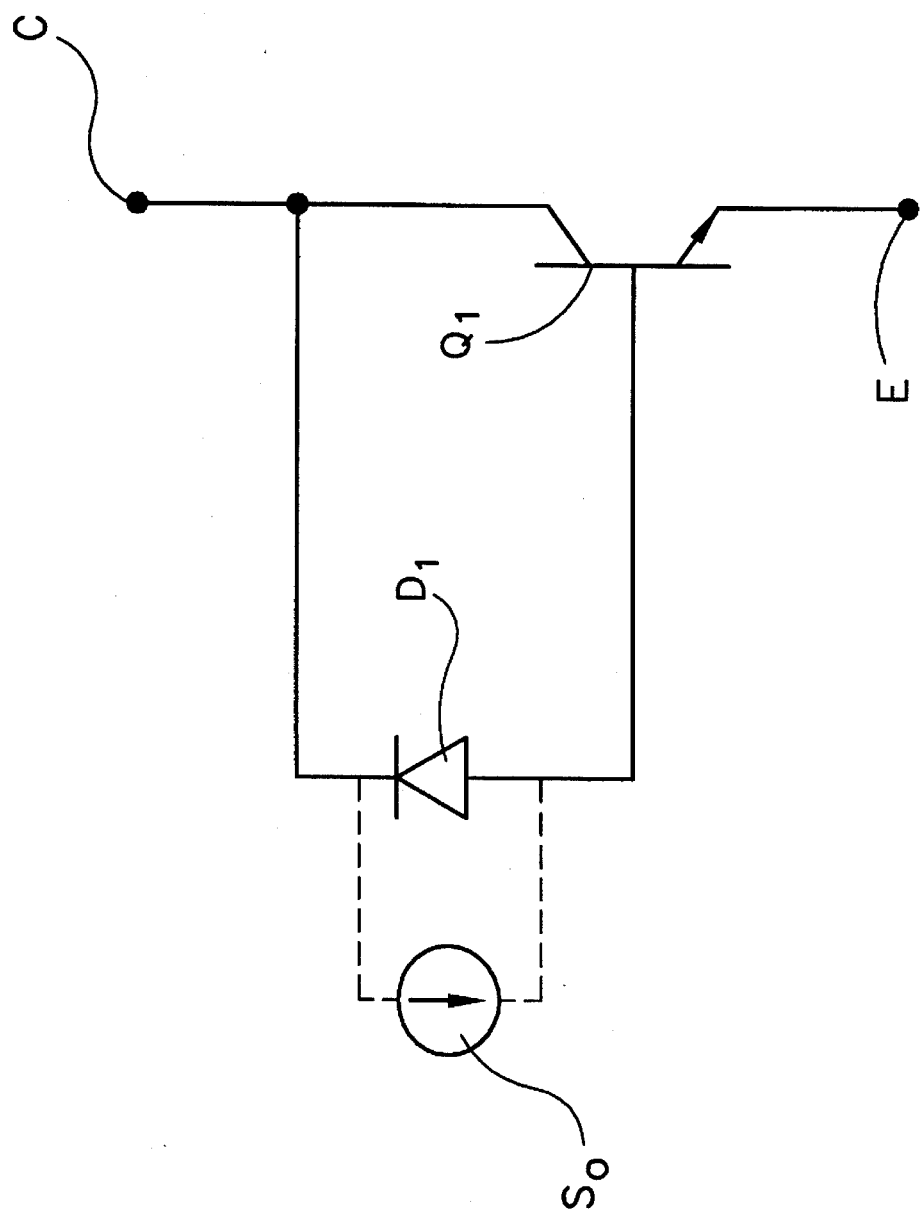
FIG. 2B is an electrical schematic of an equivalent circuit for the device shown in FIG. 2A.
Figure 2C:
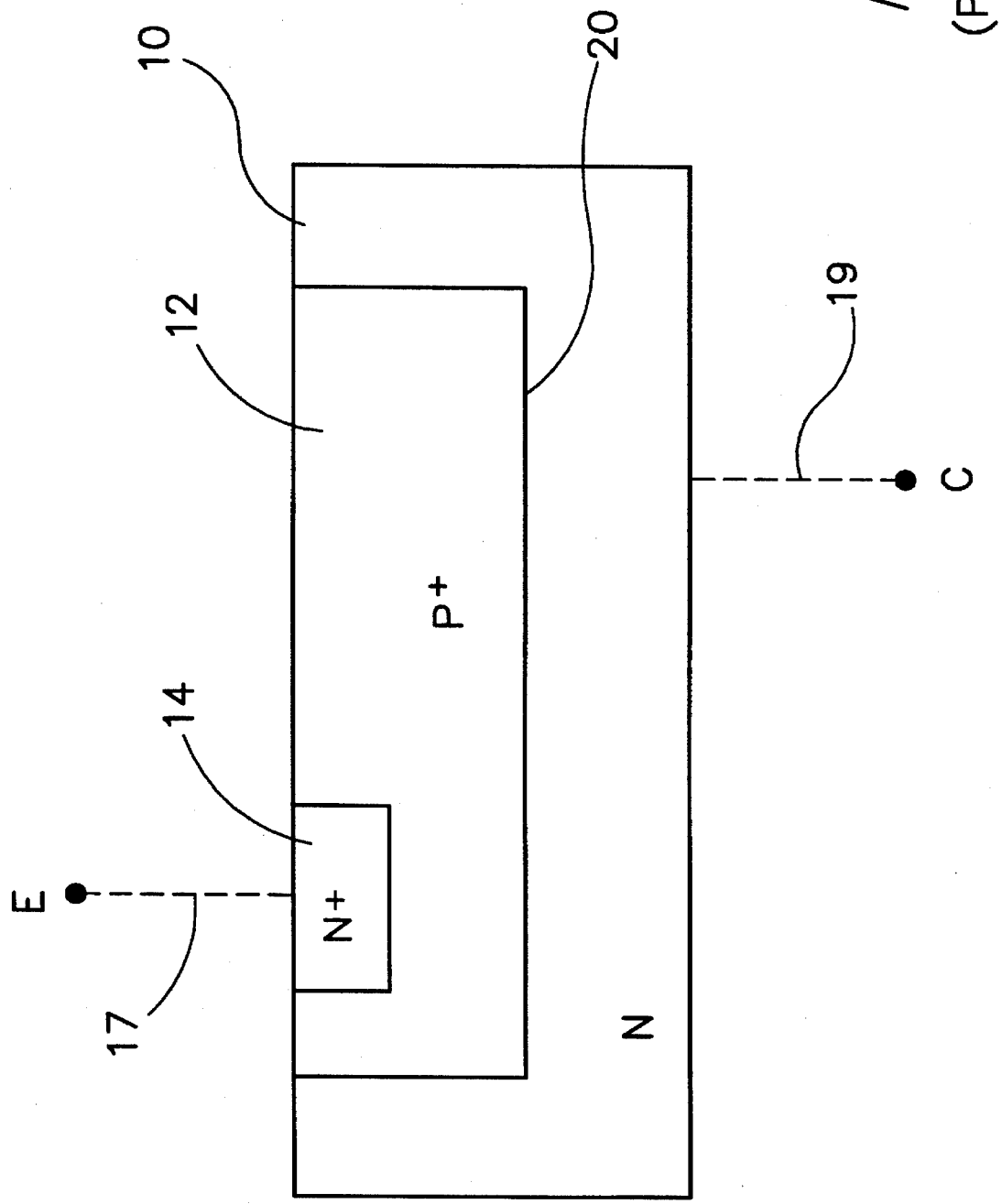
FIG. 2C is a side sectional view of the illustration of FIG. 2A.

A conventional phototransistor is represented in FIGS. 2A, 2B and 2C. As is known to those skilled in the art, a phototransistor of this type can be made by providing an N conductivity type semiconductive material 10 and then doping a portion of it with a first region 12 of P⁺ conductivity type material. Within the first region of P⁺ conductivity type material, a first region of N⁺ conductivity type material 14 is deposited. A base contact 16, an emitter contact 18 and a collector contact to the back surface are provided in order to facilitate electrical connection between the chip shown in FIG. 2A and other circuitry. FIG. 2B shows the equivalent electrical circuit of the device illustrated in FIGS. 2A and 2C. The transistor $Q_1$ is provided by the collector base and emitter base junctions formed by the N conductivity type material 10, the P⁺ conductivity type material 12 and the N⁺ conductivity type material 14. The diode $D_1$ is formed by the junction 20 between the N conductivity type material 10 and the P⁺ conductivity type material 12 shown in FIG. 2C. The symbol identified by reference letter $S_O$ represents the photocurrent created when light is imposed on the diode $D_1$. The collector and emitter contacts are arranged as shown in FIG. 2C to permit the device to be used in association with other electrical components.

Figure 3A:
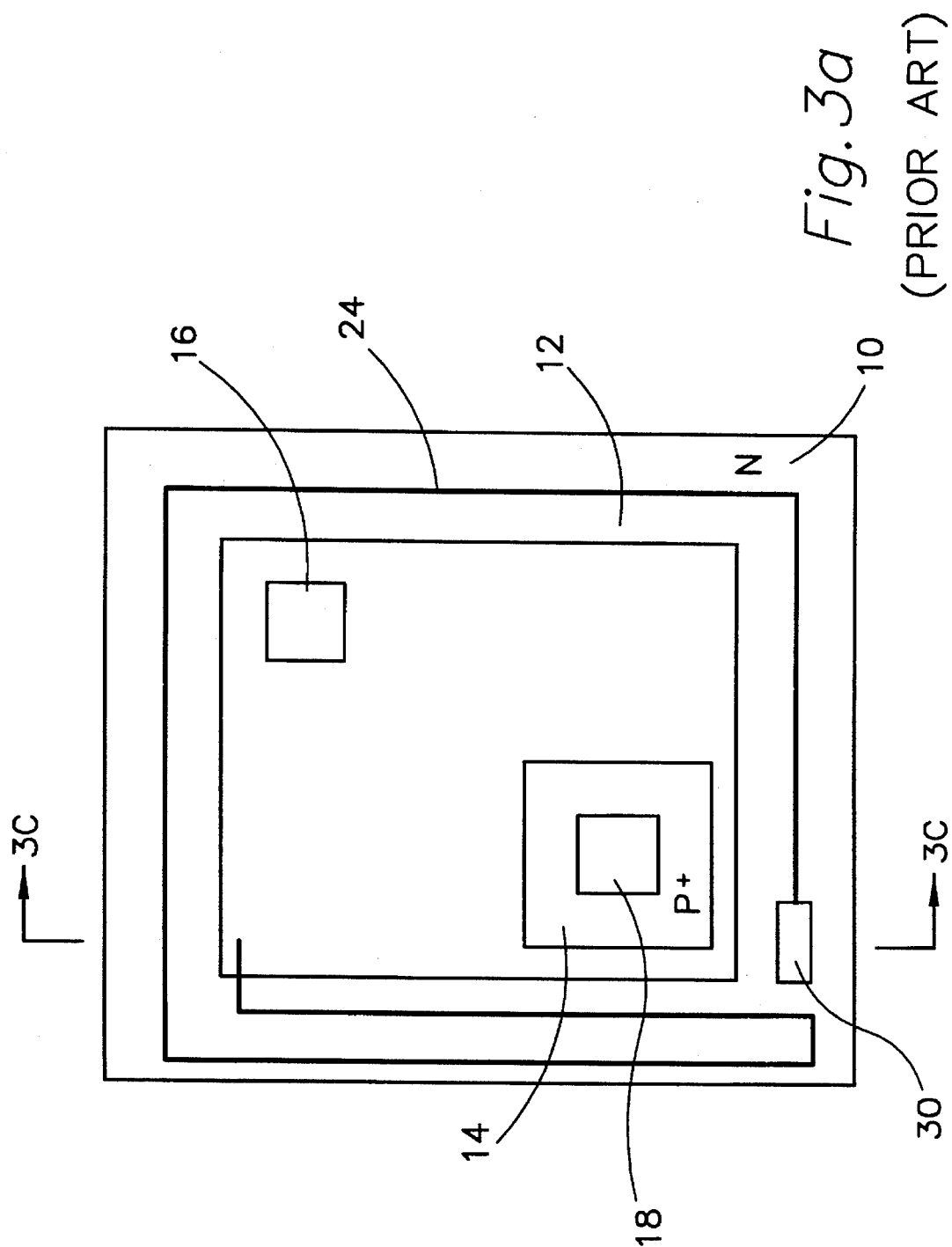
FIG. 3A shows a shunt phototransistor device.
Figure 3B:
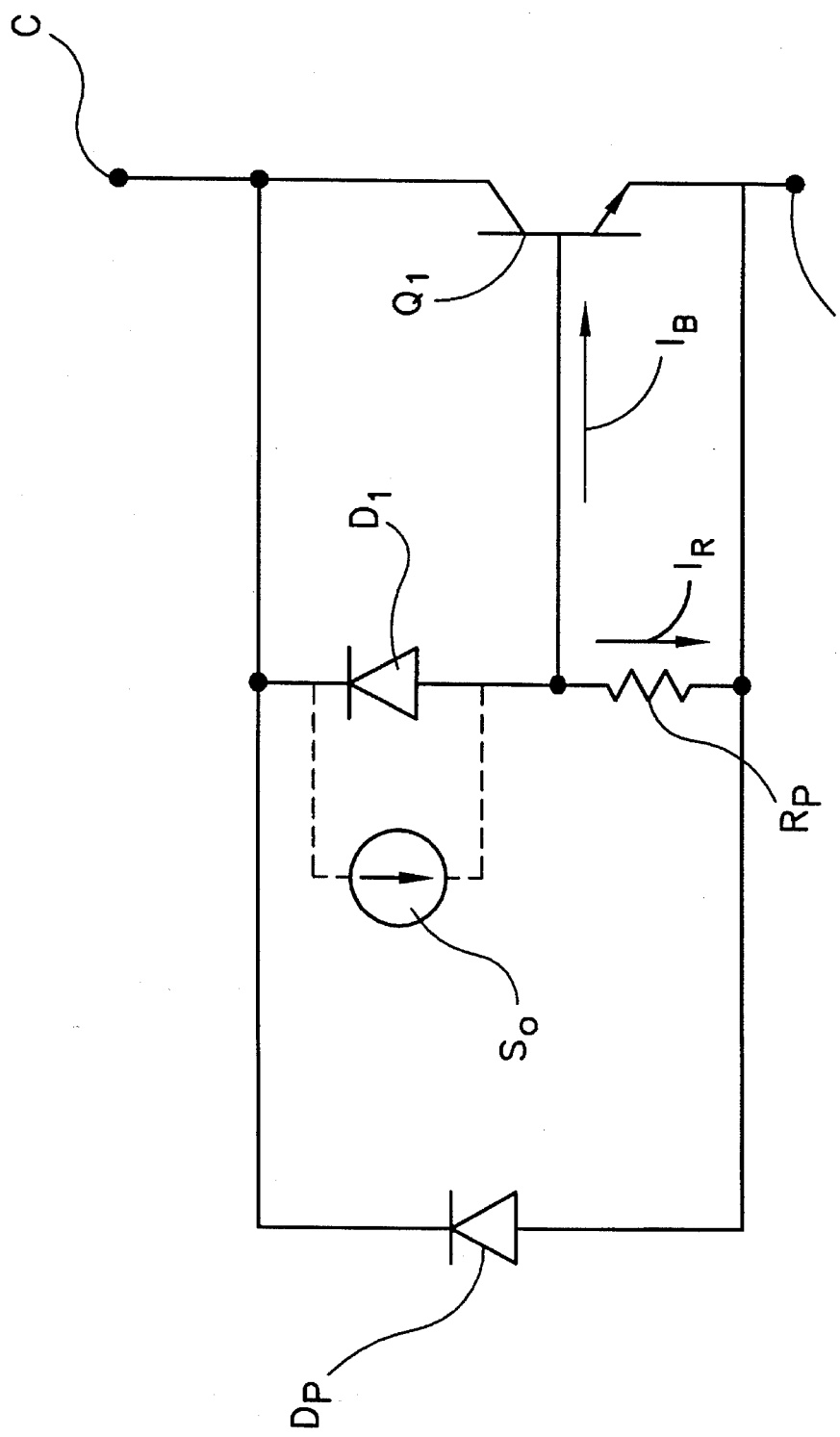
FIG. 3B is an electrical schematic of the equivalent circuit to the device shown in FIG. 3A.
Figure 3C:
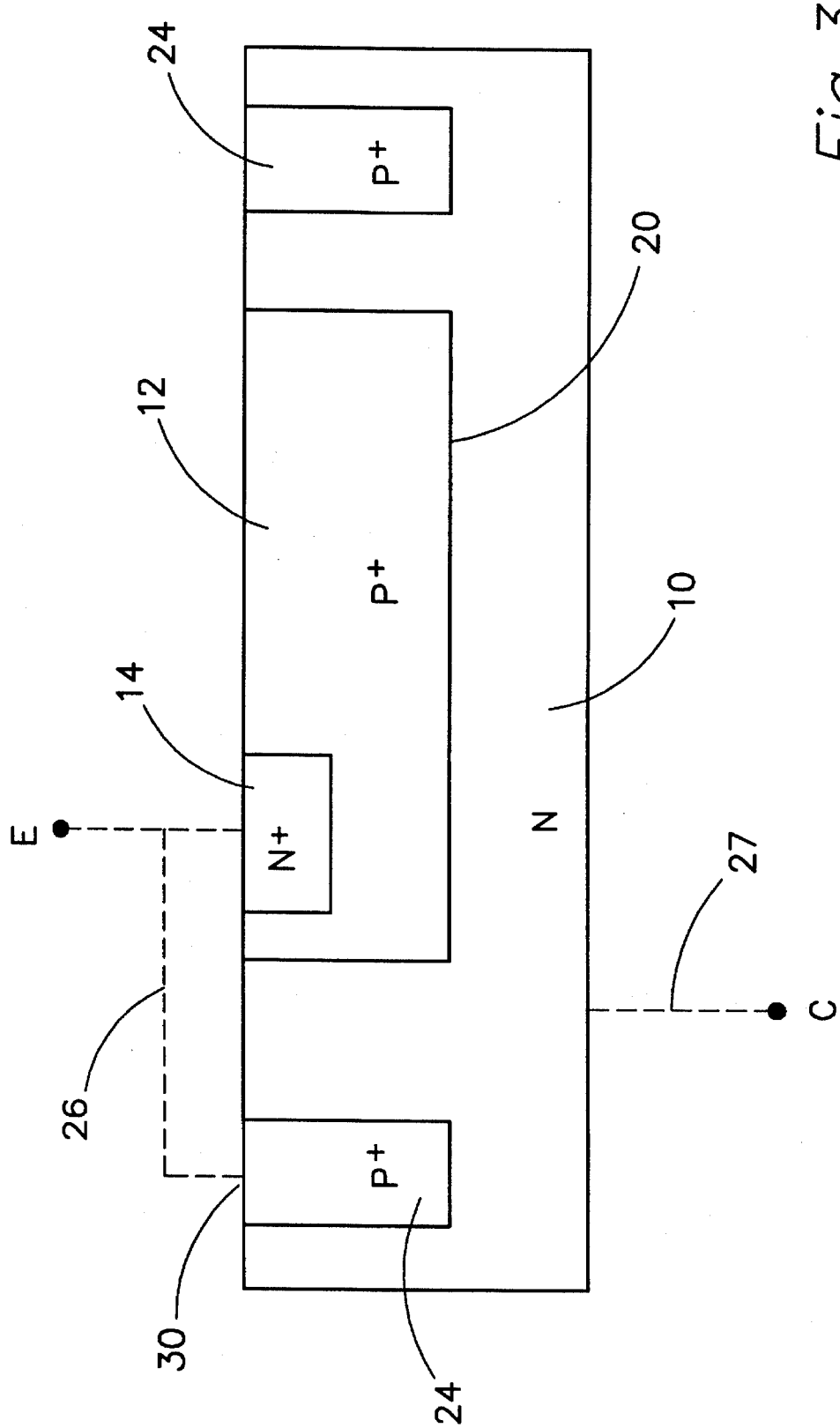
FIG. 3C is a sectional view of the device shown in FIG. 3A.

The device illustrated in FIGS. 3A, 3B and 3C represents a shunt phototransistor that is characterized by the relationship described above in conjunction with FIG. 1. In other words, it is a phototransistor that is provided with a first resistor $R_p$ that is formed by doping a second region of P⁺ conductivity type material 24 in a portion of the N conductivity type semiconductive material 10. This is illustrated in FIG. 3C. FIG. 3A shows the top view of the device. As can be seen, the first resistor 24 extends around the first region of P⁺ conductivity type material 12 between a contact 30 and the base which is formed by the first region of P⁺ conductivity type material 12. The equivalent electrical circuit of the device shown in FIGS. 3A and 3C is represented in FIG. 3B. The transistor $Q_1$ is formed by the N conductivity type semiconductive material 10, the first region of P⁺ conductivity type material 12 and the first region of N⁺ conductivity type material 14 which combine to form an NPN transistor as described above. Similarly, diode $D_1$ is formed by the junction 20 between the N conductivity type semiconductive material 10 and the first region of P⁺ conductivity type material 12.

With reference to FIGS. 3B and 3C, the junction relationship between the N conductivity type material 10 and the second region of P⁺ conductivity type material 24 provides a diode relationship that is represented in FIG. 3B by diode $D_p$ which is a parasitic diode that is formed by the structure of the first resistor 24. FIG. 3C shows the collector 27 and emitter 26 connections which would provide electrical communication between the emitter contact 18 and contact 30.

With reference to FIGS. 3B and 3C, a serious problem is caused by the parasitic diode $D_p$ that results from the junction relationship formed between the second region of P⁺ conductivity type material 24, which is used to provide the first resistor $R_p$, and the N conductivity type material 10. Because of this parasitic diode $D_p$, a reverse potential between the emitter E and collector C of transistor $Q_1$ can seriously damage the device shown in FIG. 3B because of the resulting conductive path between the emitter E and collector C that is provided by the parasitic diode $D_p$. For normal operation, the collector is biased positively with respect to the emitter. For reverse bias, the collector is negative with respect to the emitter. Therefore, the provision of the first resistor $R_p$ creates a problem because of the way that it is formed. In other words, the provision of the second region of P⁺ conductivity type material 24 within the N conductivity type material 10 creates a PN junction between these two materials that acts as a diode $D_p$ and provides a conductivity path between the emitter contact, or terminal, and collector contact, or terminal, of transistor $Q_1$.

It should be understood that the device illustrated in FIGS. 3A, 3B and 3C operates in a satisfactory manner to provide a phototransistor with a shunt resistor $R_p$ to create the light threshold $H_T$ described above in conjunction with FIG. 1. However, the device illustrated in FIGS. 3A, 3B and 3C is not appropriate for circumstances where a significant reverse bias can be connected across the emitter E and collector C of transistor $Q_1$. For example, the device might be inadvertently inserted backwards in a socket during operation or a testing procedure. This could impose a reverse bias across transistor Q1 which can damage the device.

Figure 4A:
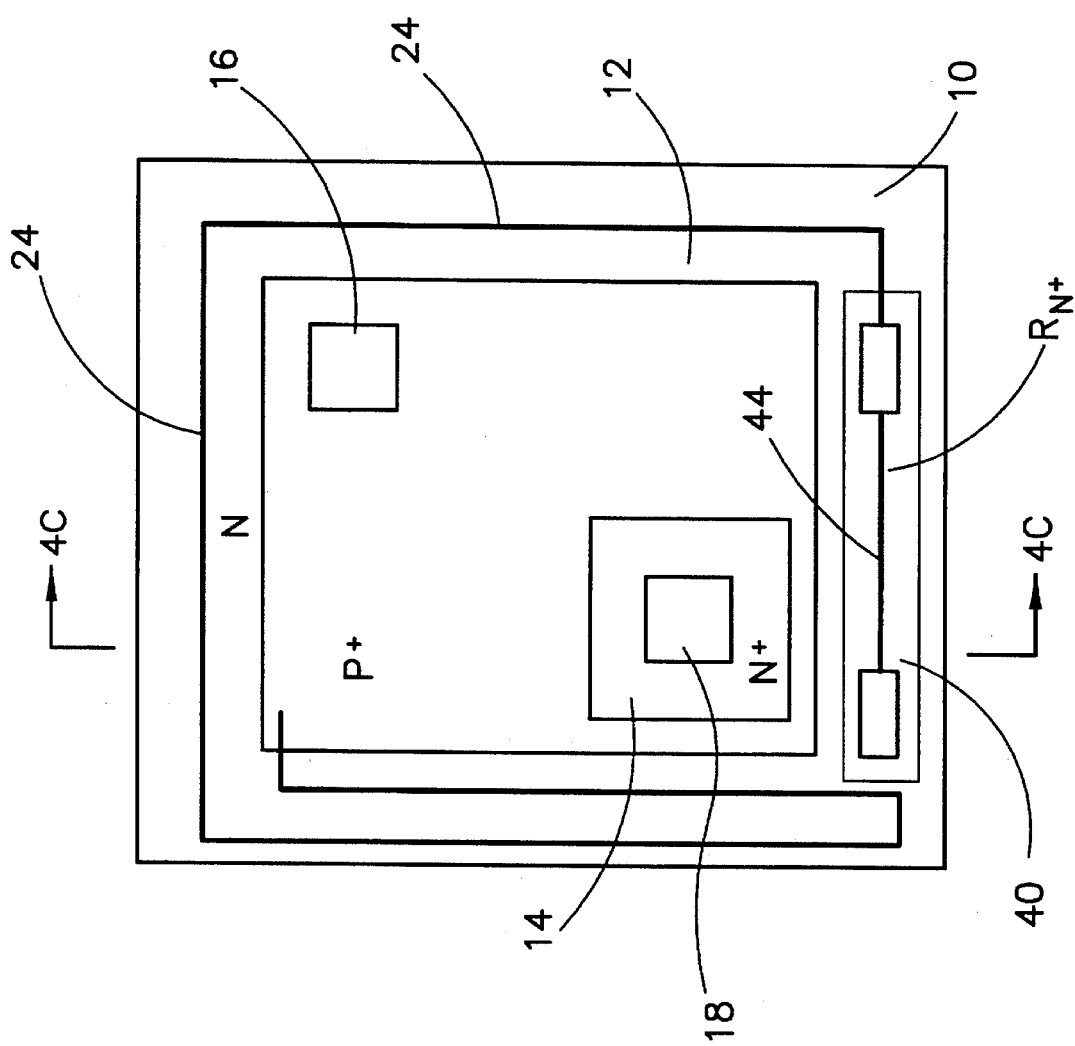
FIG. 4A is a top view of a preferred embodiment of the present invention.
Figure 4B:
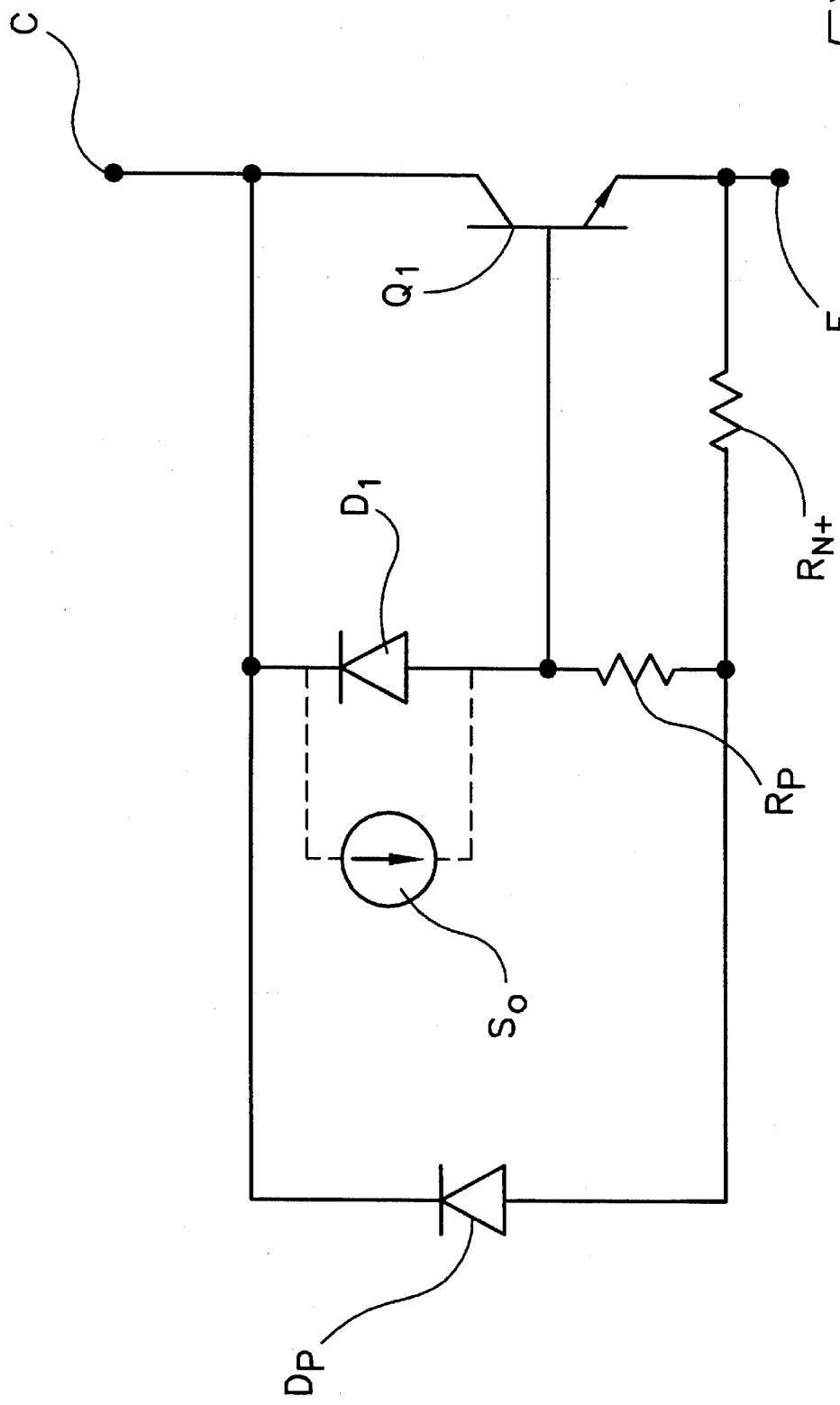
FIG. 4B is an equivalent circuit of the device shown in FIG. 4A.

FIGS. 4A, 4B and 4C show a preferred embodiment of the present invention. In FIG. 4A, the first resistor $R_p$ is provided in the manner described above in conjunction with FIG. 3C. In addition, a second resistor $R_{N+}$ is formed by doping a third region of P⁺ conductivity type material 40 in a portion of the N conductivity type material 10 and then doping a second region of N⁺ conductivity type material 44 within the third region of P⁺ conductivity type material 40. This is illustrated in FIG. 4C. The equivalent electrical circuit is illustrated in FIG. 4B. As can be seen, resistor $R_{N+}$ is disposed between the emitter E of transistor $Q_1$ and the first resistor $R_p$. The second resistor $R_{N+}$ is also connected between the emitter E of transistor $Q_1$ and the parasitic diode $D_p$. As described above in greater detail, the parasitic diode $D_p$ is the result of the junction relationship formed by the structure of the first resistor $R_p$. The presence of the parasitic diode $D_p$ creates a current path between the emitter terminal and collector terminal of transistor $Q_1$ and, in the event of a reverse voltage connected across the transistor, could damage the device. The second resistor $R_{N+}$ prevents this damage by disposing a resistance in this current path provided by the parasitic diode.

FIG. 5 is a plot of the photocurrent generated in the photodiode as a function of irradiance. The photocurrent $S_o$ increases linearly with irradiance H and divides between the resistor $R_p$ and the base of the transistor as shown in FIG. 3B. The current component through the resistor is defined in equation 1 and the current into the base is defined in equation 2.

$$I_R = V_{BE}/R_p \qquad (1)$$

$$I_B = I_S \exp(qV_{BE}/kT) \qquad (2)$$

$I_S$ and $q/kT$ are proportionality constants. For currents less than approximately 0.8 microamperes, in a typical example of the present invention $V_{BE}$ is less than 0.55 volts and the current into the base is negligible. As the photocurrent source increases, beyond this threshold value, corresponding to the threshold irradiance of FIG. 1, most of the additional current flows into the base of the transistor and produces amplified collector current $I_C$, as shown in FIG. 1. Thus the resistor $R_p$ produces a threshold value of irradiance $H_T$ shown in FIG. 1.

Although various materials can be used to provide phototransistors in the manner described above, certain semiconductive materials and doping techniques have been used to provide a preferred embodiment of the present invention.

For example, with reference to FIG. 4A, the N conductivity type material 10 is silicon in a preferred embodiment of the present invention. In alternative embodiments, the N conductivity type semiconductive material 10 could be N conductivity type AlGaAs or GaAs. The first region of P+ conductivity type material 12, which provides the base of transistor $Q_1$, can be formed by epitaxial growth using a dopant of beryllium, zinc, or magnesium. Similarly, the second region of P+ conductivity type material 24 can be formed by isolating the P+ epitaxial growth of the first region using mesa etch or proton bombardment or by ion implantation into a preselected area of the N conductivity type material 10. The third region of P+ conductivity type material 40 can be formed in the same manner as the second region of P+ conductivity type material. The first region of N+ conductivity type material 14 which provides the emitter of $Q_1$ can be AlGaAs and can be formed by epitaxial growth and doping with tellurium, selenium, or silicon. The second region of N+ conductivity type material 44 can be formed by isolating a portion of region 14 using mesa etch or proton bombardment or, for example, by etch back of layer 44 and implantation into a preselected area of the P+ region 40.

In one example, a first resistor $R_p$ with a resistance value of 700 K ohms was selected to set the desired threshold signal $H_T$ shown in FIG. 1. The resistor layout requires a significant area for the first resistor $R_p$ as shown in FIGS. 3A and 4A. The required area was minimized by designing the phototransistor device with the highest value of sheet resistance (e.g. 2.0K ohms per square) and the narrowest line width (e.g. 6.0 micrometers) that are consistent with manufacturability. The layout of the base and the resistor is shown in FIG. 3A. The resistor was arranged in a pattern that was approximately 0.084 inches in length. The cross sectional view is illustrated in FIG. 3C. Although the performance of the device illustrated in FIGS. 3A, 3B and 3C was satisfactory under a forward bias voltage potential, devices of this type can be subjected to reverse bias either during test or improper operation. As discussed above, when devices are used in certain applications, accidental reverse bias connection can occur and may cause significant damage to the device. A conventional phototransistor (i.e. as illustrated in FIGS. 2A, 2B and 2C with no shunt resistance) typically has a reverse breakdown voltage $V_{(BR)ECO}$ of 7 to 8 volts. Reverse current $I_{ECO}$ for lower values of voltage is limited to junction leakage current of the emitter base voltage, which is typically in the nanoampere range at room temperature. When the shunt phototransistor shown in FIGS. 3A, 3B and 3C was connected in a reverse bias condition, the current was excessive and potentially destructive. The high current can be explained in conjunction with FIGS. 3B and 3C. When the collector C is reverse biased with respect to the emitter E, the second region of P+ conductivity type material 24 is the anode of a forward biased diode $D_p$ that connects the emitter contact of transistor $Q_1$ to its collector contact. The N− region is conductivity modulated so that series resistance is negligible and the resultant current is high. The corrective design provided by the present invention includes a series resistor $R_{N+}$ between the emitter terminal and collector terminal of transistor $Q_1$ which would not be shorted by the forward biased diode $D_p$. The second resistor is formed from a second region of N+ conductivity type material 44 diffused within a base isolation diffusion provided by the third region of P+ conductivity type material 40. This is illustrated in FIG. 4C.

The minimum value of required resistance to be provided by the second resistor $R_{N+}$ was estimated as a function of the temperature rise of a packaged device. The thermal impedance of the package was estimated to be approximately 500 degrees centigrade per watt and the maximum temperature assumed to be 125 degrees centigrade for a room temperature ambient of 25 degrees centigrade. That represents a temperature change of approximately 100 degrees centigrade above room temperature. This represents a 0.2 watts maximum power dissipation. In order to maintain the package temperature at a value no greater than 125 degrees C., the resistance value of the second resistor $R_{N+}$ must be no less than 125 ohms. The sheet resistance of the second resistor is 5 ohms per square and its width is 6 micrometers. A resistance value of 254 ohms was achieved by using a resistor length of approximately 305 micrometers. The length of the first resistor $R_p$ in the design shown in FIGS. 4A, 4B and 4C was 88 percent of that length in the original design which did not incorporate a second resistor $R_{N+}$. As illustrated in FIGS. 4A, 4B and 4C, the second resistor $R_{N+}$ formed by the emitter diffusion limits the collector-emitter current for the reverse bias condition.

Although the present invention has been described in considerable detail and illustrated to specifically show a preferred embodiment of the present invention, it should be understood that alternative embodiments are within its scope.

The embodiments of the invention in which an exclusive property or right is claimed are defined as follows:

1. A phototransistor, comprising:

a transistor having an emitter, a collector and a base;

a diode having an anode and a cathode, said anode being connected in electrical communication with said base, said cathode being connected in electrical communication with said collector;

a first resistor connected in electrical communication between said anode and said emitter, said first resistor creating a PN junction relationship, said PN junction relationship being disposed in parallel electrical relationship with said diode and said first resistor; and a second resistor connected in electrical communication between said first resistor and said emitter, said second resistor being connected between said emitter and said PN junction relationship.

2. The phototransistor of claim 1, wherein:

said transistor is formed by doping an N conductivity type semiconductive material with a first region of P+ conductivity type semiconductive material and doping a portion of said first region of P+ conductivity type semiconductive material with a first region of N+ conductivity type semiconductive material.

3. The phototransistor of claim 1, wherein:

said diode is formed by said first region of P+ conductivity type semiconductive material and said N conductivity type semiconductive material.

4. The phototransistor of claim 3, wherein:

said first resistor is formed by doping a portion of said N conductivity type semiconductive material with a second region of P+ conductivity type semiconductive material.

5. The phototransistor of claim 4, wherein:

said PN junction relationship is formed by said second region of P+ conductivity type semiconductive material and said N conductivity type semiconductive material.

6. The phototransistor of claim 5, wherein:

said second resistor is formed by doping said N conductivity type semiconductive material with a third region of P+ conductivity type semiconductive material and doping said third region of P⁺ conductivity type semiconductive material with a second region of N⁺ conductivity type semiconductive material.

7. The phototransistor of claim 6, wherein: said N conductivity type material is GaAs.

8. The phototransistor of claim 7, wherein:
said first region of P⁺ conductivity type semiconductive material is GaAs.

9. The phototransistor of claim 8, wherein:
said first region of N⁺ conductivity type semiconductive material is AlGaAs.

10. The phototransistor of claim 9, wherein:
said second region of P⁺ conductivity type semiconductive material is GaAs.

11. The phototransistor of claim 10, wherein:
said second region of N⁺ conductivity type semiconductive material is AlGaAs.

12. The phototransistor of claim 11, wherein:
said third region of P⁺ conductivity type semiconductive material is GaAs.

13. A phototransistor, comprising:
a transistor having an emitter, a collector and a base;
a diode having an anode and a cathode, said anode being connected in electrical communication with said base, said cathode being connected in electrical communication with said collector;
a first resistor connected in electrical communication between said anode and said emitter, said first resistor creating a PN junction relationship, said PN junction relationship being disposed in parallel electrical relationship with said diode and said first resistor; and
a second resistor connected in electrical communication between said first resistor and said emitter, said second resistor being connected between said emitter and said PN junction relationship, said transistor being formed by doping an N conductivity type semiconductive material with a first region of P⁺ conductivity type semiconductive material and doping a portion of said first region of P⁺ conductivity type semiconductive material with a first region of N⁺ conductivity type semiconductive material.

14. The phototransistor of claim 13, wherein:
said diode is formed by said first region of P⁺ conductivity type semiconductive material and said N conductivity type semiconductive material; and
said first resistor is formed by doping a portion of said N conductivity type semiconductive material with a second region of P⁺ conductivity type semiconductive material.

15. The phototransistor of claim 14, wherein:
said PN junction relationship is formed by said second region of P⁺ conductivity type semiconductive material and said N conductivity type semiconductive material; and
said second resistor is formed by doping said N conductivity type semiconductive material with a third region of P⁺ conductivity type semiconductive material and doping said third region of P⁺ conductivity type semiconductive material with a second region of N⁺ conductivity type semiconductive material.

16. The phototransistor of claim 15, wherein:
said N conductivity type material is AlGaAs;
said first region of P⁺ conductivity type semiconductive material is GaAs;
said first region of N⁺ conductivity type semiconductive material is AlGaAs;
said second region of P⁺ conductivity type semiconductive material is GaAs;
said second region of N⁺ conductivity type semiconductive material is AlGaAs; and
said third region of P⁺ conductivity type semiconductive material is GaAs.

17. A phototransistor, comprising:
a transistor having an emitter, a collector and a base;
a diode having an anode and a cathode, said anode being connected in electrical communication with said base, said cathode being connected in electrical communication with said collector;
a first resistor connected in electrical communication between said anode and said emitter, said first resistor creating a PN junction relationship, said PN junction relationship being disposed in parallel electrical relationship with said diode and said first resistor; and
a second resistor connected in electrical communication between said first resistor and said emitter, said second resistor being connected between said emitter and said PN junction relationship, said transistor being formed by doping an N conductivity type semiconductive material with a first region of P⁺ conductivity type semiconductive material and doping a portion of said first region of P⁺ conductivity type semiconductive material with a first region of N⁺ conductivity type semiconductive material, said diode being formed by said first region of P⁺ conductivity type semiconductive material and said N conductivity type semiconductive material, said first resistor is formed by doping a portion of said N conductivity type semiconductive material with a second region of P⁺ conductivity type semiconductive material, said PN junction relationship is formed by said second region of P⁺ conductivity type semiconductive material and said N conductivity type semiconductive material, said second resistor is formed by doping said N conductivity type semiconductive material with a third region of P⁺ conductivity type semiconductive material and doping said third region of P⁺ conductivity type semiconductive material with a second region of N⁺ conductivity type semiconductive material.

18. The phototransistor of claim 17, wherein:
said N conductivity type material is AlGaAs;
said first region of P⁺ conductivity type semiconductive material is AlGaAs;
said first region of N⁺ conductivity type semiconductive material is AlGaAs;
said second region of P⁺ conductivity type semiconductive material is AlGaAs;
said second region of N⁺ conductivity type semiconductive material is AlGaAs; and
said third region of P⁺ conductivity type semiconductive material is AlGaAs.

\* \* \* \* \*